United States Patent [19]

Blank et al.

[11] Patent Number: 5,136,241
[45] Date of Patent: Aug. 4, 1992

[54] DEVICE FOR SENSING UNWANTED ELECTRIC AND MAGNETIC FIELDS IN A REMOTE SENSOR ELECTRICAL LEAD

[75] Inventors: Robert G. Blank; Steven K. Clark, both of Groton, Conn.

[73] Assignee: The United States of America as represented by the Secretary of the Navy, Washington, D.C.

[21] Appl. No.: 573,084

[22] Filed: Aug. 27, 1990

[51] Int. Cl.⁵ .......................................... G01R 33/025
[52] U.S. Cl. ................................... 324/225; 324/260; 324/262
[58] Field of Search ............................. 324/260–262, 324/227, 225, 226, 224, 207.12, 239, 243, 234, 235, 236, 207.23, 700, 442, 173, 174, 204, 244, 247, 249; 336/84 R, 84 C, 84 M; 330/67, 258; 333/12; 174/35

[56] References Cited

U.S. PATENT DOCUMENTS

| | | | |
|---|---|---|---|
| 3,002,384 | 10/1961 | MacDonald et al. | 324/173 |
| 3,609,527 | 9/1971 | Ellis | 324/207.18 |
| 4,023,293 | 5/1977 | Aslan | 324/247 |
| 4,219,805 | 8/1980 | Magee et al. | 324/204 |
| 4,684,888 | 8/1987 | Tabak | 324/225 |
| 4,839,580 | 6/1987 | Moore et al. | 324/700 |
| 4,843,325 | 6/1989 | McKee, Jr. | 324/442 |
| 4,847,556 | 7/1989 | Langley | 324/207.24 |
| 4,878,019 | 10/1989 | Tsaprazis et al. | 324/225 |
| 4,901,015 | 2/1990 | Pospischil et al. | 324/174 |

*Primary Examiner*—Kenneth A. Wieder
*Assistant Examiner*—Warren S. Edmonds
*Attorney, Agent, or Firm*—Michael J. McGowan; Prithvi C. Lall; Michael F. Oglo

[57] ABSTRACT

A device is provided for measuring unwanted electric and magnetic field induced voltages in a test lead of a remote measurement sensor. A test lead is encased within a magnetic shielding conduit and is electrically connected to a remote sensor. Another electrical lead, identical to the test lead and also encased within the magnetic shielding conduit, is terminated by a short circuit in the vicinity of the sensor. This electrical lead travels through the same environment as the test lead on its way to the measuring equipment. Electro-magnetic field interference along the path of this electrical lead is an indication of the electro-magnetic field interference along the path of the test lead.

6 Claims, 1 Drawing Sheet

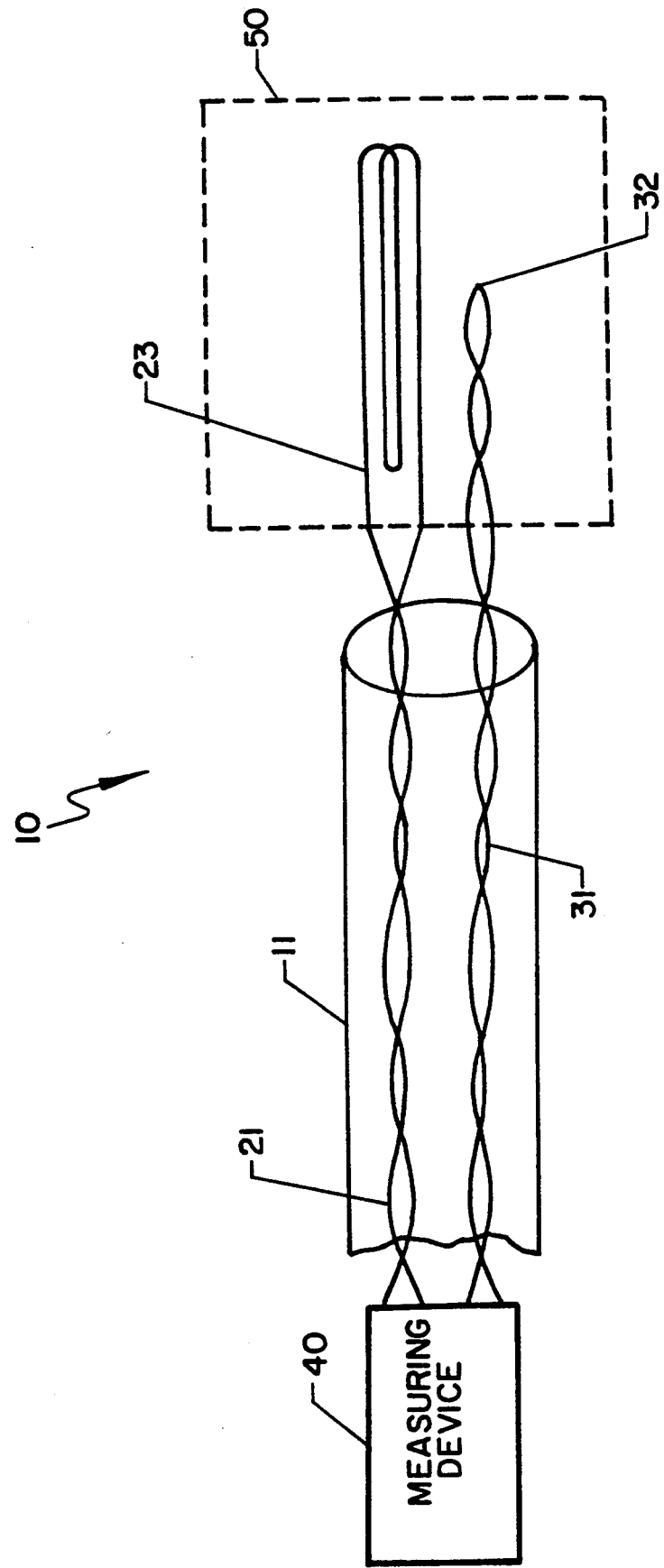

DEVICE FOR SENSING UNWANTED ELECTRIC AND MAGNETIC FIELDS IN A REMOTE SENSOR ELECTRICAL LEAD

STATEMENT OF GOVERNMENT INTEREST

The invention described herein may be manufactured and used by or for the Government of the United States of America for Governmental purposes without the payment of any royalties thereon or therefor.

BACKGROUND OF THE INVENTION

(1) Field of the Invention

The present invention generally relates to remote measurement sensors and more particularly to a device for measuring unwanted electric and magnetic field induced voltages in a test lead connected to a remote measurement sensor.

(2) Description of the Prior Art

Alternating magnetic fields are usually measured with a sensor coil. Frequently, the sensor coil is a remote sensor inside a test fixture of high magnetic attenuation while the test lead from the remote sensor to the measuring equipment must pass through a strong magnetic field environment surrounding the test fixture. In these test configurations, faulty measurement readings can be created by voltages induced in the test lead exposed to the strong magnetic field. Generally, a sensor is considered to be a remote sensor when the sensor is 6 feet or more away from the measuring equipment.

Faulty readings can also be created by the electric field coupling caused by the voltage potential between the test fixture and the remote sensor or test lead. Quantification of this electro-magnetic field induced interference in the test lead is especially critical when attempting to measure low level alternating current (AC) signals.

SUMMARY OF THE INVENTION

Accordingly, it is an object of the present invention to provide an apparatus for measuring unwanted electric and magnetic field induced voltages in a test lead of a remote measurement sensor.

Other objects and advantages of the present invention will become more apparent hereinafter in the specification and the drawing.

In accordance with the present invention, an apparatus has been designed to measure magnetic induction and electric field induced voltages in the test lead of a remote sensor when the sensor is placed in an AC magnetic field to be measured. A magnetic conduit encases a twisted test lead that is electrically connected to the sensor placed in the field to be measured. This lead provides a signal equal to the output of the sensor plus the unwanted noise voltages induced in the test lead. Another twisted electrical is encased within the magnetic conduit and is terminated by a short circuit in the vicinity of the sensor. This electrical lead: 1) is of the same length as the test lead, 2) travels essentially the same path as the test lead, and 3) measures only the unwanted electric and magnetic field induced voltages that are simultaneously being induced in the test lead connected to the sensor.

BRIEF DESCRIPTION OF THE DRAWING

The FIGURE shows a schematic representation of the measuring apparatus in accordance with the present invention.

DESCRIPTION OF THE PREFERRED EMBODIMENT

Referring now to the FIGURE, there is shown a schematic representation of the apparatus 10 according to the present invention for measuring unwanted electric and magnetic field induced voltages in the test lead of a remote sensor such as a magnetic sensor coil 23. A magnetic conduit 11 encases two electrical leads 21 and 31. Magnetic conduit 11 is typically any conventional magnetic shielding conduit that has a magnetic attenuation of at least 40 dB at frequencies above 30 kHz. Depending on the application, it may also be desirable for magnetic conduit 11 to be flexible. The length of magnetic conduit 11 may vary but is nominally 10–20 feet for a remote sensor.

Electrical leads 21 and 31 are both two-stranded, twisted electrical leads of equal length. Leads 21 and 31 are each tightly twisted to minimize magnetic pick-up on the way to a measuring device 40. Typically, leads 21 and 31 are made of copper and are enamel covered to minimize the spacing between the strands of each of leads 21 and 31. In essence, lead 31 is identical to lead 21.

Lead 21 extends from one end of magnetic conduit 11 to electrically connect to a magnetic sensor coil 23. The electrical connection may be made by any conventional means such as solder or pin connections as long as good electrical continuity is maintained. Alternatively, the construction of lead 21 and sensor coil 23 as shown may be formed from a single lead that is twisted upon itself within conduit 11 and forms the loop(s) of sensor coil 23. Lead 21 extends from the other end of magnetic conduit 11 for connection to a measuring device 40 such as an oscilloscope or spectrum analyzer. While the invention is being described for a magnetic sensor coil 23, it is not limited thereto. The apparatus of the present invention will also function if, for example, an acoustic transducer replaced sensor coil 23. In general, the apparatus of the present invention will quantify any unwanted electric and magnetic field induced voltages found in the test lead of a remote sensor.

Sensor coil 23 is typically placed in a magnetic shielding test fixture. The portion of the sensor coil 23 which resides within the test fixture is generally designated by numeral 50. Accordingly, sensor coil 23 may vary with respect to its loop size and number of turns depending on the geometry or symmetry of the magnetic shielding test fixture 50. As the loop size and the number of turns increase, the signal generated by sensor coil 23 also increases. It is desirable to generate the largest signal possible from sensor coil 23 in order to achieve maximum sensitivity required to measure a low level AC signal. However, a sensor coil design that maximizes sensitivity also results in the creation of a high inductance. In turn, this inductance can produce unwanted resonances and high inductive reactance thereby promoting unwanted electrostatic pickup by sensor coil 23 from the electric field provided by the magnetic field source (not shown).

In order to measure the aforementioned electrostatic interference at sensor coil 23, a second electric lead 31 encased within magnetic conduit 11 is provided to measure as a common mode voltage, only the unwanted electrostatic interference found in the vicinity of the sensor coil 23. Lead 31 is terminated by a short circuit at 32 in the vicinity of sensor coil 23 such that it is exposed to the same AC signal environment as sensor coil 23. Termination of lead 31 at 32 is accomplished by shorting the ends of lead 31 together. Alternatively, lead 31 could be a single lead twisted upon itself. Thus, the only significant pick-up by lead 31 would be magnetic interference along its length and electrostatic pickup from the end 32 seen, for example as a common mode voltage signal at the measuring device 40. Since lead 31 is identical to and travels through the same path environment as lead 21, the electrostatic and magnetic interference found in lead 31 is representative of the unwanted noise in lead 21.

The advantages of the present invention are numerous. Remote sensor coil 23 may be designed for maximum sensitivity for low level AC signals while its test lead 21 can be tested for unwanted noise. Furthermore, the simple and inexpensive construction of the present invention makes it an invaluable tool for any remote sensor test configuration.

Thus, it will be understood that many additional changes in the details, materials, steps and arrangement of parts, which have been herein described and illustrated in order to explain the nature of the invention, may be made by those skilled in the art within the principle and scope of the invention as expressed in the appended claims.

What is claimed is:

1. An apparatus for sensing unwanted electric and magnetic field induced voltages in a test lead that electrically connects a measuring device to a sensor exposed to a low level AC signal environment, the sensor being further remotely located with respect to the measuring device, said apparatus comprising:
   a magnetic shielding conduit substantially encasing the test lead of the sensor, wherein the test lead is electrically connected to the sensor outside said conduit;
   an electrical lead identical to the test lead substantially encased within said conduit and being further electrically connected to the measuring device, said electrical lead terminating in a short circuit in the low level AC signal environment outside of said conduit, whereby said electrical lead senses only the unwanted electric and magnetic field induced voltages in the test lead.

2. An apparatus as in claim 1 wherein said magnetic shielding conduit is a flexible magnetic shielding conduit.

3. An apparatus as in claim 1 wherein the test lead and said electrical lead are each two-stranded, twisted leads.

4. An apparatus as in claim 1 wherein said electrical lead is a single electrical lead twisted upon itself.

5. An apparatus as in claim 1 wherein the test lead and electrical lead comprise enamel covered wire.

6. An apparatus for sensing unwanted electric and magnetic field induced voltages along a path environment of a test lead that electrically connects a measuring device to a sensor exposed to a low level AC signal environment, the sensor being further remotely located with respect to the measuring device, said apparatus comprising:
   a magnetic shielding conduit substantially encasing the test lead of the sensor, wherein the test lead is electrically connected to the sensor outside said conduit;
   an electrical lead identical to the test lead traversing the test lead path environment and being further electrically connected to the measuring device, said electrical lead terminating in a short circuit in the low level AC signal environment outside of said conduit, whereby said electrical lead senses only the unwanted electric and magnetic field induced voltages along the test lead path environment.

* * * * *